United States Patent
Shen

(10) Patent No.: US 7,762,315 B2
(45) Date of Patent: Jul. 27, 2010

(54) SECTIONAL MODULAR HEAT SINK

(75) Inventor: Ching-Hang Shen, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 211 days.

(21) Appl. No.: 12/215,134

(22) Filed: Jun. 25, 2008

(65) Prior Publication Data
US 2009/0194253 A1 Aug. 6, 2009

(30) Foreign Application Priority Data
Feb. 1, 2008 (TW) .............................. 97202201 U

(51) Int. Cl.
*H05K 7/20* (2006.01)
(52) U.S. Cl. ...................... 165/80.3; 361/704
(58) Field of Classification Search ................ 165/80.2, 165/80.3, 185; 361/704, 710
See application file for complete search history.

(56) References Cited

U.S. PATENT DOCUMENTS

| | | | |
|---|---|---|---|
| 5,819,407 A * | 10/1998 | Terada | 29/890.03 |
| 5,882,136 A * | 3/1999 | Pyritz et al. | 403/24 |
| 6,279,648 B1 * | 8/2001 | Diels et al. | 165/80.3 |
| 6,375,423 B1 * | 4/2002 | Roberts et al. | 416/2 |
| 6,557,955 B2 * | 5/2003 | Saravis | 312/111 |
| 6,637,109 B2 * | 10/2003 | Nyqvist | 29/890.03 |
| 6,648,715 B2 * | 11/2003 | Wiens et al. | 446/121 |
| 2003/0082986 A1 * | 5/2003 | Wiens et al. | 446/120 |
| 2006/0180486 A1 * | 8/2006 | Bennett | 206/308.1 |

FOREIGN PATENT DOCUMENTS

EP 0867937 9/1998

* cited by examiner

*Primary Examiner*—Allen J Flanigan

(57) ABSTRACT

A sectional modular heat sink is formed from a plurality of stacked modular heat radiating units, each of which is provided on one side along at least one longitudinal edge with a pair of arm portions, each of which being vertically extended or upward and outward inclined; and on an opposite side with a U-shaped or a V-shaped channel corresponding to the pair of arm portions. A horizontally extended flange is provided along a free edge of each arm portion, and a horizontally extended groove is provided along each of two innermost edges of the channel corresponding to the flanges on the arm portions. When two modular heat radiating units are stacked, the arm portions and the flanges on a first modular heat radiating unit respectively engage with the channel and the grooves on a second modular heat radiating unit to firmly connect the two units to one another.

4 Claims, 8 Drawing Sheets

SECTIONAL MODULAR HEAT SINK

FIELD OF THE INVENTION

The present invention relates to a sectional modular heat sink, and more particularly to a heat sink formed from a plurality of modular heat radiating units.

BACKGROUND OF THE INVENTION

An electronic apparatus generally includes an enclosure to define a closed inner space, within which a plurality of different electronic elements work for the electronic apparatus to operate. These electronic elements produce heat during work. Therefore, elements capable of dissipating heat produced by the electronic elements must be additionally provided in the electronic apparatus to help in cooling the heat-producing electronic elements. Heat sink is one example of such heat dissipating elements. The conventional heat sink is normally made of a metal material having high heat conductivity. In the past, a big-scale heat sink is manufactured by way of casting or forging. To manufacture the heat sink by casting or forging, it is necessary to develop a big-size mold, which is not only heavy and inconvenient to manufacture and transport, but also expensive and non-economic for use.

EP 0867937 discloses a sectional modular lamellar heat dissipator for electronic circuits. Please refer to FIGS. 1 and 2 that are exploded and assembled perspective views, respectively, showing the sectional modular lamellar heat dissipator 1 disclosed in EP 0867937. As shown, the heat dissipator 1 is assembled from a plurality of modular heat radiating units 11 made of extruded aluminum. Each of the heat radiating units 11 is formed on a first plane 111, say, a top surface, along each of two longitudinal edges with two parallelly extended fins 1111, and on a second plane opposite to the first plane 111 with a V-shaped groove 1112 corresponding to the two fins 1111. To stack and assemble two modular heat radiating units 11 together, the parallel fins 1111 on a lower one of the two units 11 are forced into the V-shaped grooves 1112 on an upper one of the two units 11. At this point, the parallel fins 1111 are deformed corresponding to the configuration of the V-shaped grooves 1112, so that the two modular heat radiating units 11 are connected to each other. Other modular heat radiating units 11 may be sequentially stacked in the same manner. With the sectional modular lamellar heat dissipator 1, the problem of heavy and expensive mold for casting or forging a big-scale heat sink is solved. However, the sectional modular lamellar heat dissipator 1 has some disadvantages in practical use thereof. When the fins 1111 are forced into the V-shaped grooves 1112 and deformed, stress concentration will occur at a neck portion of the fins 1111 in contact with the first plane 111. As a result, two modular heat radiating units 11 that have been connected to each other through engagement of the fins 1111 with the V-shaped grooves 1112 are still subject to separation due to broken fins 1111. Further, it is also possible the fins 1111 are not smoothly and fully forced into the V-shaped grooves 1112, and two modular heat radiating units 11 are not fully closely attached to each other. That is, there might be voids between the fins 1111 and the V-shaped grooves 1112 to cause thermal choking. Moreover, since the fins 1111 are deformed under external force, they are not repeatedly usable.

In brief, the conventional sectional modular heat sink 1 has the following disadvantages: (1) the modular heat radiating units have a connecting structure that is subject to breaking to thereby cause separation of two assembled modular heat radiating units from one another; (2) the modular heat radiating units could not be fully tightly connected and closely attached to one another to thereby cause thermal choking between them; (3) stress concentration tends to occur at deformed areas on the modular heat radiating units; (4) the modular heat radiating units have poor structural strength; and (5) the modular heat radiating units are not repeatedly usable.

It is therefore tried by the inventor to develop a sectional modular heat sink assembled from a plurality of improved modular heat radiating units.

SUMMARY OF THE INVENTION

A primary object of the present invention is to provide a sectional modular heat sink formed from a plurality of modular heat radiating units, which can be easily manufactured at reduced cost while enable continuous, stable, and firm connection to one another to form the sectional modular heat sink.

To achieve the above and other objects, the sectional modular heat sink according to the present invention is formed by sequentially stacking and connecting a plurality of modular heat radiating units to one another. Each of the modular heat radiating units is provided on one side along at least one longitudinal edge with a pair of arm portions, each of which being vertically extended or upward and outward inclined; and on an opposite side with a U-shaped or a V-shaped channel corresponding to the pair of arm portions. A substantially horizontally extended flange is provided along a free edge of each of the arm portions, and a substantially horizontally extended groove is provided along each of two innermost edges of the channel corresponding to the flanges on the arm portions.

When two modular heat radiating units are stacked, the arm portions and the flanges on a first modular heat radiating unit respectively engage with the channel and the grooves on a second modular heat radiating unit to firmly connect the two units to one another.

The sectional modular heat sink according to the present invention provides the following advantages: (1) the modular heat radiating units have simplified structure and can be easily-manufactured; (2) the modular heat radiating units may be tightly connected to closely attach to one another; (3) the modular heat radiating units can be quickly assembled together to form the heat sink; (4) the modular heat radiating units have high structural strength; and (5) the modular heat radiating units may be manufactured at reduced cost and high productivity.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
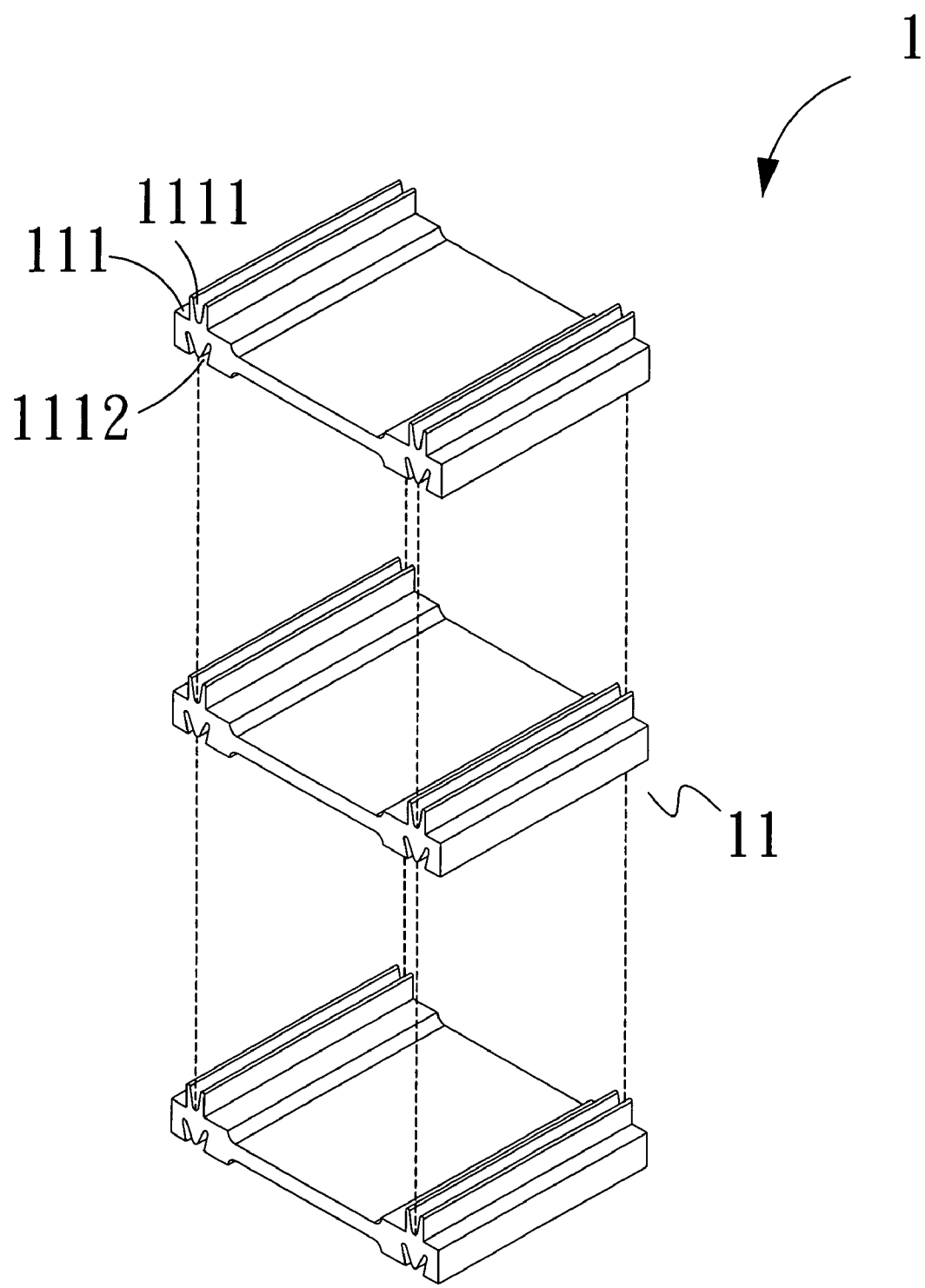
FIG. 1 is an exploded perspective view of a conventional sectional modular lamellar heat dissipator.
Figure 2:
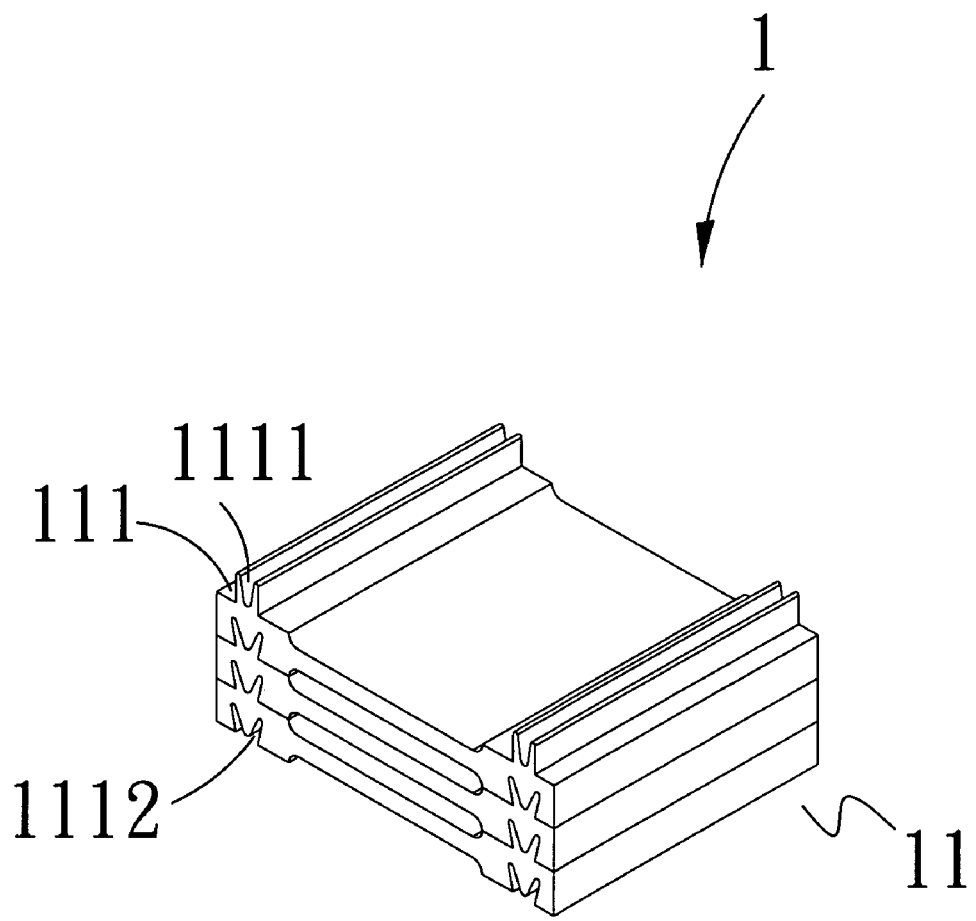
FIG. 2 is an assembled view of FIG. 1.
Figure 3:
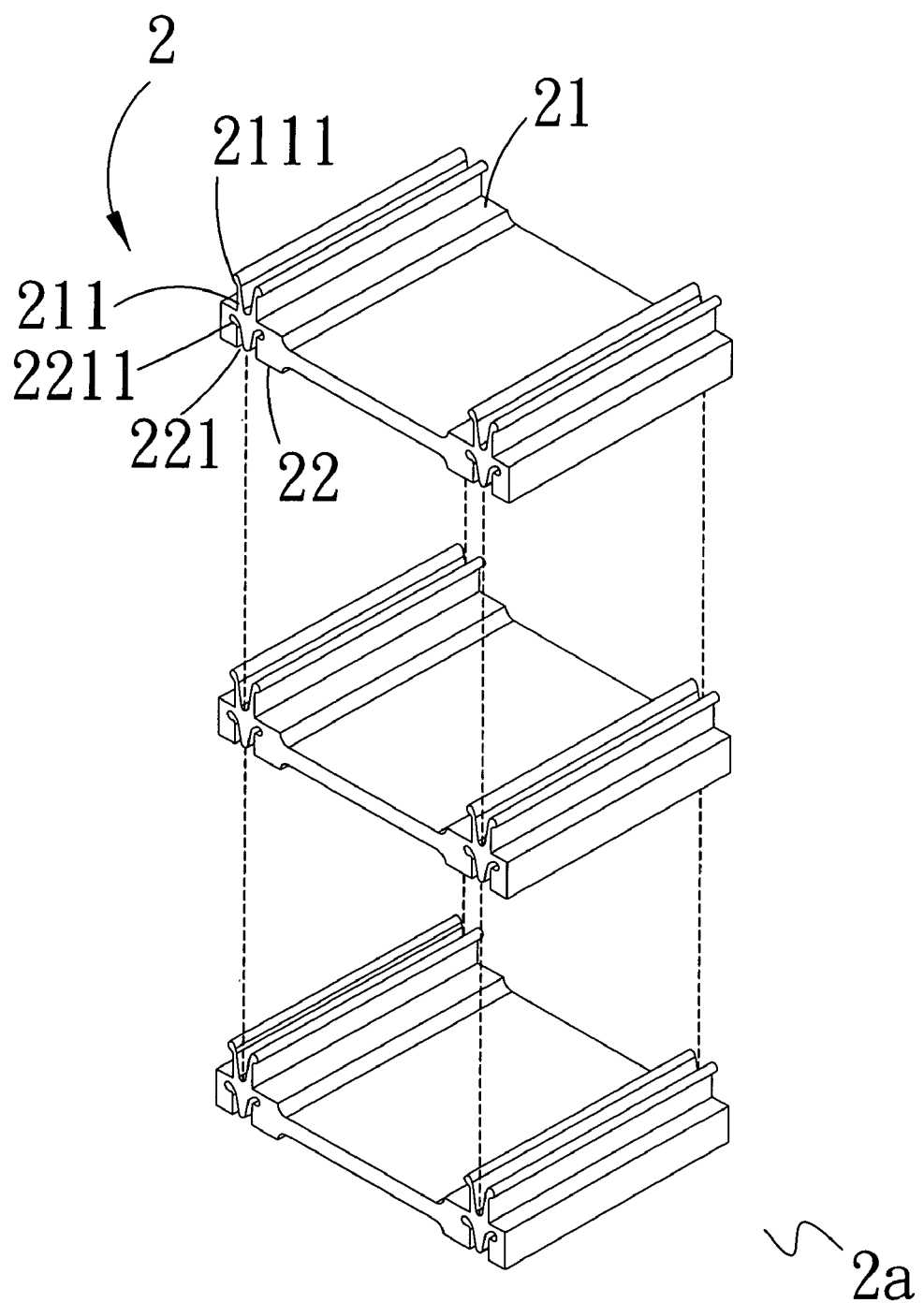
FIG. 3 is an exploded perspective view of a sectional modular heat sink assembled from a plurality of modular heat radiating units according to a first embodiment of the present invention.
Figure 4:
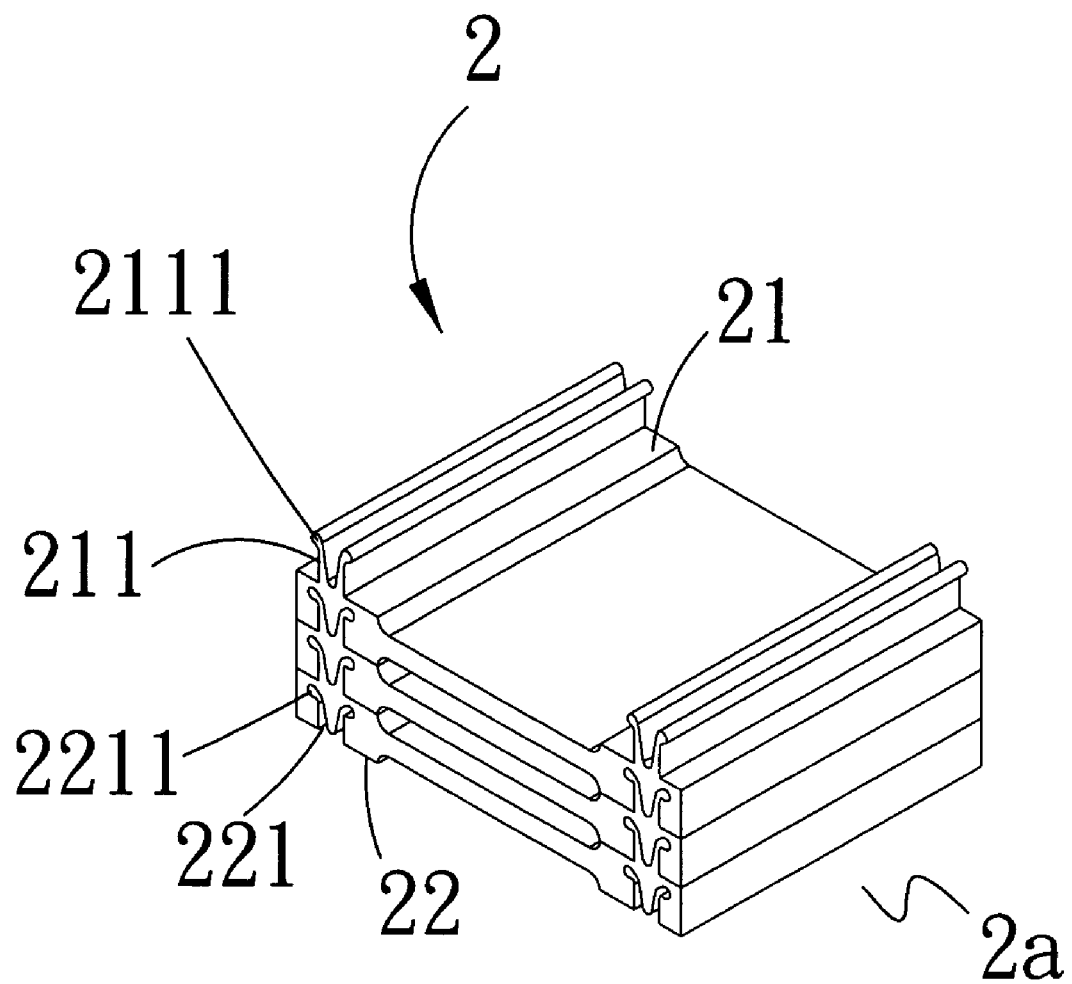
FIG. 4 is an assembled view of FIG. 3.

Please refer to FIGS. 3 and 4 that are exploded and assembled perspective views, respectively, of a sectional modular heat sink 2 according to a first embodiment of the present invention. As shown, the sectional modular heat sink 2 is assembled from a plurality of modular heat radiating units 2a.

Each of the modular heat radiating units 2a is provided on a first plane 21, say, an upper surface thereof, along each of two longitudinal edges with at least one pair of parallel arm portions 211. The two arm portions 211 are upward and outward inclined. Each of the two arm portions 211 is provided along a free edge with a substantially horizontally outward extended flange 2111. The modular heat radiating unit 2a is further provided on a second plane 22 opposite to the first plane 21 with a substantially V-shaped channel 221 corresponding to each pair of the outward inclined arm portions 211. Each of the V-shaped channels 221 is provided along each of two innermost edges with an outward extended groove 2211 corresponding to the flanges 2111 on the pair of arm portions 211. Therefore, through engagement of the arm portions 211 and the flanges 2111 of a first modular heat radiating unit 2a with the channels 221 and the grooves 2211 of a second modular heat radiating unit 2a, respectively, two modular heat radiating units 2a may be quickly stacked and connected to one another. In the same manner, a plurality of the modular heat radiating units 2a may be sequentially and continuously stacked and assembled together to form the sectional modular heat sink 2. The modular heat radiating units 2a having the arm portions 211 with the flanges 2111 and the channels 221 with the grooves 2211 can be more firmly and stably assembled to one another to thereby exactly overcome the disadvantages in the conventional sectional modular lamellar heat dissipator 1.

Figure 5:
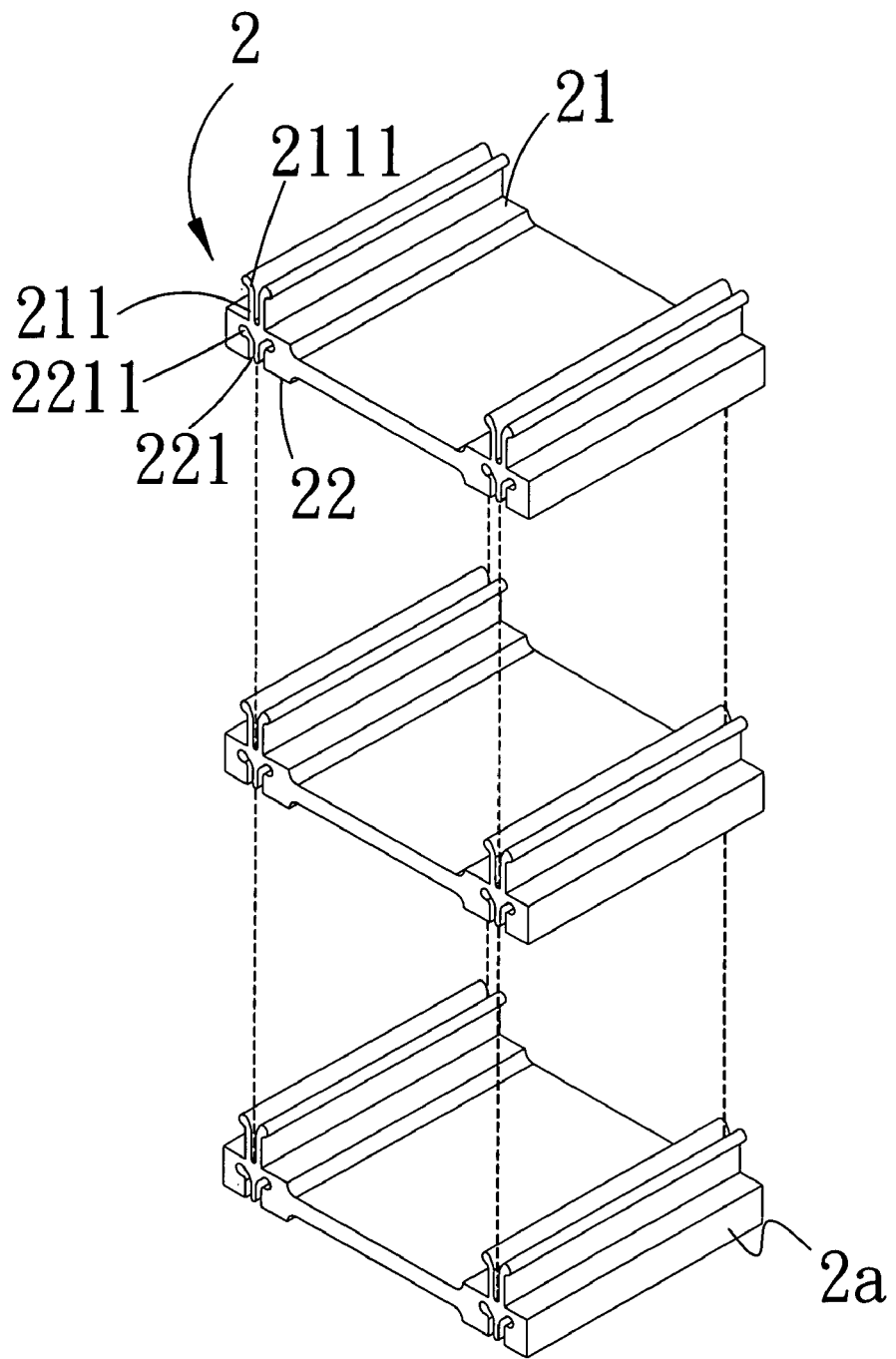
FIG. 5 is an exploded perspective view of a sectional modular heat sink assembled from a plurality of modular heat radiating units according to a second embodiment of the present invention.
Figure 6:
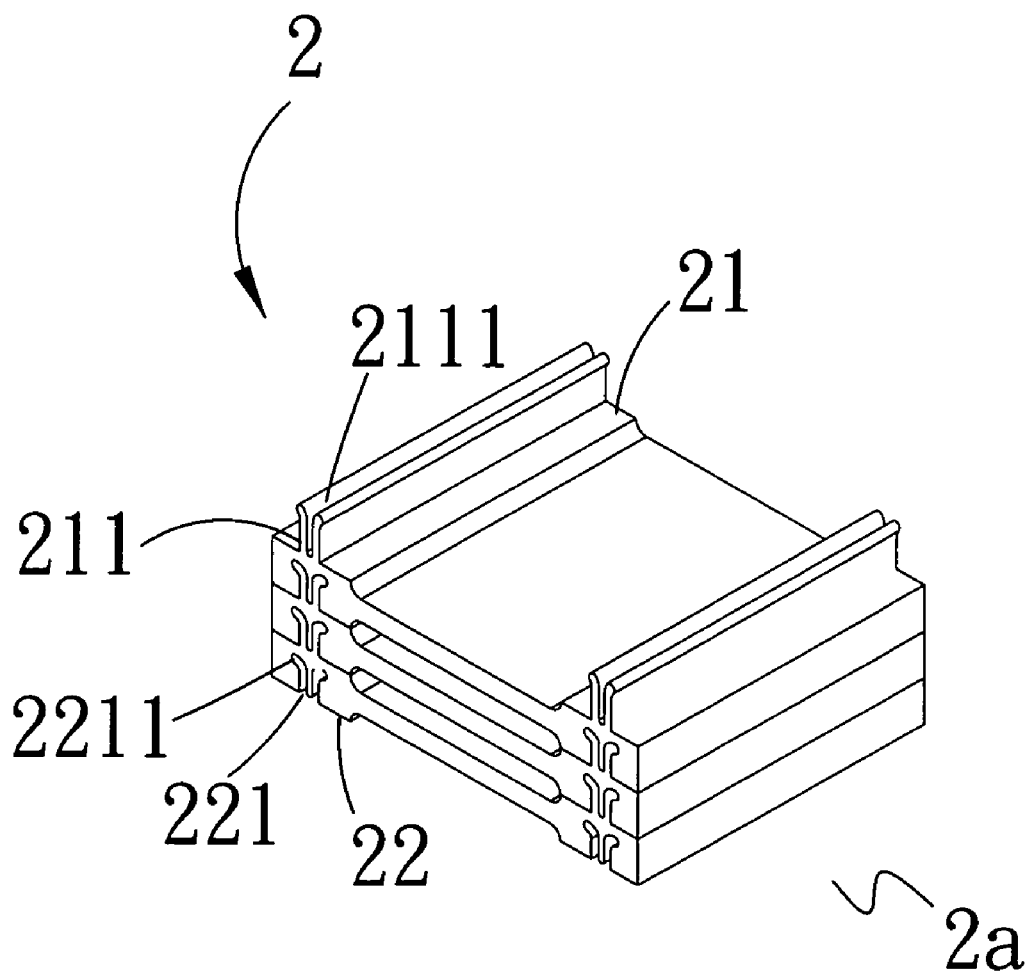
FIG. 6 is an assembled view of FIG. 5.

FIGS. 5 and 6 are exploded and assembled perspective views, respectively, of a sectional modular heat sink 2 according to a second embodiment of the present invention. As shown, the second embodiment is generally structurally similar to the first embodiment, except that the arm portions 211 are vertically extended upward, and the channels 221 are substantially U-shaped.

Figure 7:
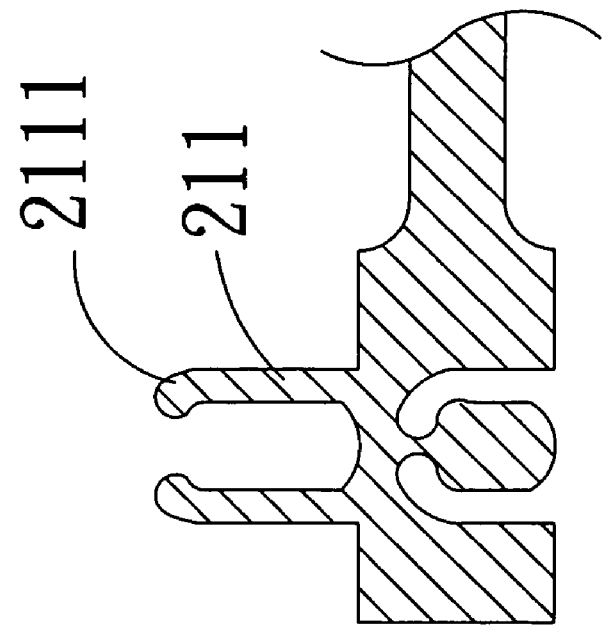
FIGS. 7a and 7b are fragmentary cross-sectional views of two modular heat radiating units for forming sectional modular heat sinks according to a third and a fourth embodiment of the present invention, respectively.
Figure 7:
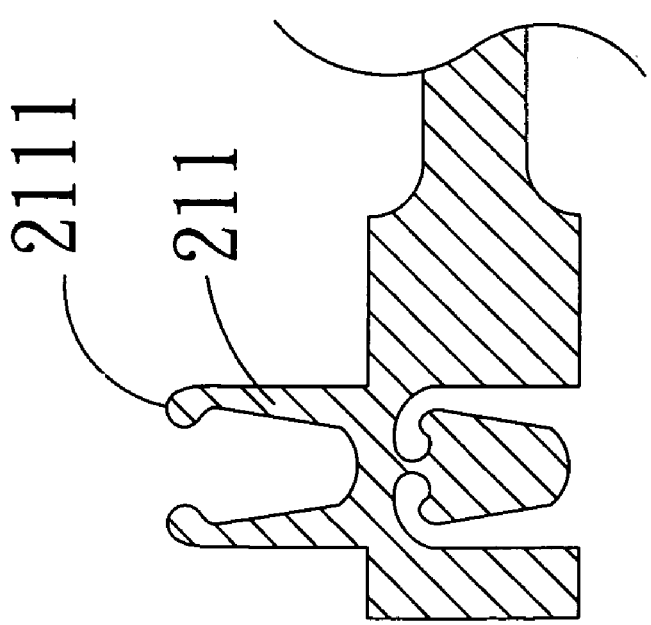

FIGS. 7a and 7b are fragmentary cross-sectional views of two modular heat radiating units according to a third and a fourth embodiment of the present invention, respectively. As shown, the modular heat radiating unit according to the third embodiment as shown in FIG. 7a is generally structurally similar to that in the first embodiment, except that each of the arm portions 211 is provided along the free edge with a substantially horizontally inward extended flange 2111, and each of the channels 221 is provided along each of the innermost edges with an inward extended groove corresponding to the inward extended flanges 2111. And, the modular heat radiating unit according to the fourth embodiment as shown in FIG. 7b is generally structurally similar to that in the second embodiment, except that each of the arm portions 211 is provided along the free edge with a substantially horizontally inward extended flange 2111, and each of the channels 221 is provided along each of the innermost edges with an inward extended groove corresponding to the inward extended flanges 2111. Both of the modular heat radiating units in the third and the fourth embodiment can be sequentially stacked and connected to form a firm and stable sectional modular heat sink 2.

Figure 8:
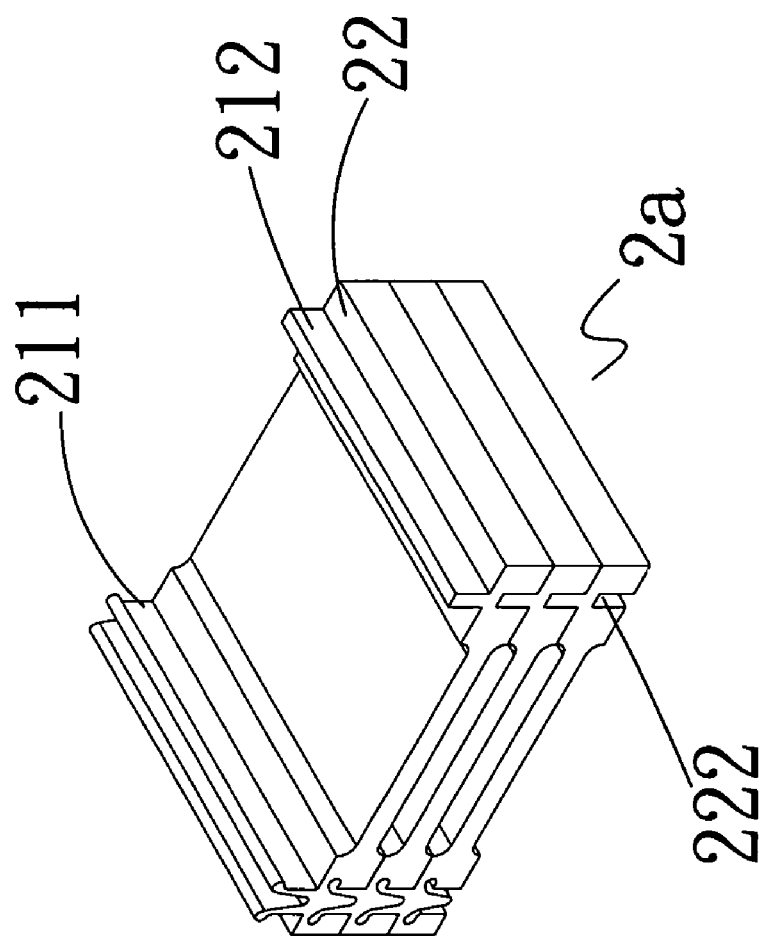
FIG. 8 is an assembled perspective view of a sectional modular heat sink assembled from a plurality of modular heat radiating units according to a fifth embodiment of the present invention.

FIG. 8 is an assembled perspective view of a sectional modular heat sink according to a fifth embodiment of the present invention. The sectional modular heat sink in the fifth embodiment is generally structurally similar to those in the first to fourth embodiments. However, each of the modular heat radiating units 2a for the sectional modular heat sink in the fifth embodiment is provided on the first plane along only one longitudinal edge with the pair of arm portions 211. Along the other longitudinal edge of the modular heat radiating unit 2a, there is provided an upright rail portion 212. Meanwhile, a long slot 222 is provided on the second plane corresponding to the rail portion 212. When two modular heat radiating units 2a are stacked, the engagement of the rail portion 212 on a first modular heat radiating unit 2a with the slot 222 on a second modular heat radiating unit 2a may further prevent the two modular heat radiating units 2a from moving relative to one another.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A sectional modular heat sink comprising a plurality of modular heat radiating units, each of the modular heat radiating units including:
   at least one pair of arm portions provided on a first plane of the modular heat radiating unit along a predetermined position, such that the two arm portions incline upward and outward;
   a substantially horizontal extended flange provided along a free edge of each of the arm portions;
   at least one substantially V-shaped channel provided on a second plane of the modular heat radiating unit opposite to the first plane to correspond to the at least one pair of arm portions; and
   a substantially horizontally extended groove provided along each of two innermost edges of the at least one V-shaped channel;
   whereby a plurality of the modular heat radiating units may be sequentially stacked and connected to one another to form the sectional modular heat sink through engagement of the at least one pair of arm portions and the flanges on a first modular heat radiating unit with the at least one channel and the grooves on a second modular heat radiating unit, respectively.

2. The sectional modular heat sink as claimed in claim 1, wherein the flanges may be selectively horizontally extended from the free edges of the arm portions in any one of an inward direction and an outward direction.

3. The sectional modular heat sink as claimed in claim 1, wherein the modular heat radiating unit is further provided on the first plane along a predetermined position opposite to the at least one pair of arm portions with an upright rail.

4. The sectional modular heat sink as claimed in claim 3, wherein the modular heat radiating unit is further provided on the second plane with a long slot corresponding to the rail; whereby when two modular heat radiating units are stacked, the rail portion on a first modular heat radiating unit engages with the long slot on a second modular heat radiating unit to prevent the two modular heat radiating units from moving relative to one another.

* * * * *